United States Patent [19]

Tanaka et al.

[11] Patent Number: 4,820,891
[45] Date of Patent: Apr. 11, 1989

[54] INDUCTION HEATED COOKING APPARATUS

[75] Inventors: Teruya Tanaka, Yokkaichi; Katsuharu Matsuo, Nishikasugai, both of Japan

[73] Assignee: Kabushiki Kaisha Toshiba, Kawasaki, Japan

[21] Appl. No.: 127,927

[22] Filed: Nov. 30, 1987

[30] Foreign Application Priority Data

Nov. 29, 1986 [JP] Japan .................................. 61-285037
Feb. 16, 1987 [JP] Japan .................................. 62-33037
May 29, 1987 [JP] Japan .................................. 62-136031

[51] Int. Cl.$^4$ ............................................. H05B 6/08
[52] U.S. Cl. .......................... 219/10.77; 219/10.493; 363/97
[58] Field of Search ...................... 219/10.77, 10.493; 363/97, 98, 79, 80

[56] References Cited

U.S. PATENT DOCUMENTS

| | | | |
|---|---|---|---|
| 3,551,632 | 12/1970 | Geisel | 219/10.77 |
| 3,770,928 | 11/1973 | Kornrumf et al. | 219/10.77 |
| 3,781,505 | 12/1973 | Steigerwald | 219/10.493 |
| 4,556,770 | 12/1985 | Tazima et al. | 219/10.77 |
| 4,686,340 | 8/1987 | Fukasawa | 219/10.77 |
| 4,749,836 | 6/1988 | Matsuo et al. | 219/10.77 |

FOREIGN PATENT DOCUMENTS 1370863 7/1972 United Kingdom.
1413219 11/1973 United Kingdom.
1472492 5/1975 United Kingdom.

Primary Examiner—Philip H. Leung
Attorney, Agent, or Firm—Cushman, Darby & Cushman

[57] ABSTRACT

An induction heated cooking apparatus for heating a removable cooking vessel having one of high resistance and a low resistance. The apparatus includes a power source for supplying a power source voltage, an induction heating device responsive to the power source for inducing an eddy current in the cooking vessel, including an induction coil device for exposing the vessel to a magnetic field for inducing the eddy current and a device for generating a high frequency current for inducing the magnetic field, an impedance state detection circuit for detecting the high frequency current, a frequency state detection circuit for detecting the frequency of the high frequency current and a control circuit for controlling the induction heating device in response to the impedance state detection circuit and the frequency state detection circuit.

7 Claims, 10 Drawing Sheets

INDUCTION HEATED COOKING APPARATUS

FIELD OF THE INVENTION

The present invention relates to an induction heated cooking apparatus, and more particularly, to an induction heated cooking apparatus with circuits for controlling the apparatus depending on the presence and type of cooking vessel.

BACKGROUND OF THE INVENTION

In a typical induction heated cooking apparatus, a high-frequency current is supplied from a frequency inverter to an induction heating coil, which generates a high-frequency magnetic field for subjecting a cooking vessel, such as a metal pan, along with food contained therein, to heat. The induction heating coil constitutes a resonant circuit together with a capacitor. The cooking vessel is placed on the apparatus adjacent to the induction heating coil. The high-frequency magnetic field induces an eddy-current in the body of the cooking vessel. Heat arises in the body of the cooking vessel as an eddy-current loss, due to the skin resistance of the body material of the cooking vessel against the eddy-current. As a result, the food contained in the cooking vessel is cooked by the heat.

When the cooking vessel is removed from the apparatus during or after the cooking operation, the apparatus goes to a non-load state. In the non-load state, the input impedance of the resonant circuit is enormously decreased, so that the high-frequency current in the resonant circuit greatly increases. This phenomenon has been heretofore utilized to detect the presence of the cooking vessel on the apparatus.

The high-frequency current is detected by a current transformer. When the detected current exceeds a predetermined value, a prescribed control circuit deactivates the frequency inverter. As a result, the induction heated cooking apparatus is protected from an erroneous heating operation in the non-load state.

As will be understood from the above description, the heat arises in the body of the cooking vessel due to the skin resistance. Therefore, it is desirable to use a cooking vessel made of high resistance metal. For this reason, the preferred cooking vessel for induction heated cooking is generally made of high resistance metal, such as iron or stainless steel.

In recent years, however, attempts have been made to develop an induction heated cooking apparatus which can operate effectively with cooking vessels made of low resistance copper or aluminum, as well as a vessel made of high resistance iron or stainless steel. To heat such a copper or aluminum vessel effectively, it is necessary to intensify the skin resistance of the body of the cooking vessel and/or the eddy-current induced in the body of the cooking vessel.

The eddy-current can be intensified by increasing the high-frequency current in the resonant circuit. For example, an increase of the input impedance of the resonant circuit is effective to increase the high-frequency current. The skin resistance can be intensified by raising the frequency of the magnetic field caused by the high-frequency current in the resonant circuit. This is because the skin resistance Rs is generally defined as follows:

$$Rs = \sqrt{F \cdot \mu \cdot r} \quad (1)$$

where F represents the frequency of the high-frequency current, $\mu$ represents the permeability, and represents the specific resistance of the metal.

Further, the input impedance Z of the resonant circuit is defined as follows:

$$Zs = K \cdot N^2 \cdot \sqrt{F \cdot \mu \cdot r} \quad (2)$$

where K represents a constant, and N represents the number of winding turns of the induction heating coil. The permeability $\mu$ and the specific resistance r are constant for each metal.

As is seen from the above equation (1), the skin resistance Rs is increased by raising the frequency F. As seen from equation (2), the input impedance Z is increased by increasing the number of turns N and/or raising the frequency F.

Attempts to make an induction heated cooking apparatus which can operate effectively with cooking vessels made of copper or aluminum and iron or stainless steel have resulted in a problem. The presence of a lo resistance cooking vessel on the apparatus could not be accurately detected. This is because the resonant circuit has a similar low input impedance both in the non-load state of the cooking vessel and in the load state of a cooking vessel made of copper or aluminum.

Accordingly, it has been further attempted to discriminate between body materials of cooking vessels made of copper or aluminum and cooking vessels made of iron or stainless steel b using the difference between the resonant frequencies of the resonant circuit for each material. That is, copper or aluminum has a good response for a relatively high resonant frequency, as described above. By contrast, iron or stainless steel has a good response for a relatively low resonant frequency. Thus, it was assumed that a cooking vessel made of copper or aluminum could be discriminated from a cooking vessel made of iron or stainless steel by using the difference between the resonant frequencies.

However stainless steel has two different resonant frequencies. That is, magnetic stainless steel has a low resistance and a low resonant frequency, like iron. However, non-magnetic stainless steel has a low resistance and a high resonant frequency, like copper and aluminum.

Therefore, it has been eagerly desired to develop an induction heated cooking apparatus which can be used with cooking vessels made of many metals, i.e.. iron, magnetic stainless steel, non-magnetic stainless steel, copper or aluminum.

SUMMARY OF THE INVENTION

It is, therefore, an object of the present invention to provide an induction heated cooking apparatus which can be used with cooking vessels made of a variety of metals, i.e., iron, magnetic stainless steel, non-magnetic stainless steel, copper or aluminum.

Another object of the present invention to provide an induction heated cooking apparatus which can discriminate a non-load state of the cooking vessel from a load state with vessels made of various metals, i.e., iron, magnetic stainless steel, non-magnetic stainless steel, copper or aluminum.

In order to achieve the above object, an induction heated cooking apparatus for heating a removable cooking vessel having one of high resistance and a low resistance according to one aspect of the present invention includes a power source for supplying a power source voltage, an induction heating device responsive to the power source for inducing an eddy current in the cooking vessel, including an induction coil device for exposing the vessel to a magnetic field for inducing the eddy current and a device for generating a high frequency current for inducing the magnetic field, an impedance state detection circuit for detecting the high frequency current, a frequency state detection circuit for detecting the frequency of the high frequency current and a control circuit for controlling the induction heating device in response to the impedance state detection circuit nd the frequency state detection circuit.

Additional objects and advantages of the present invention ill be apparent to persons skilled in the art from study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
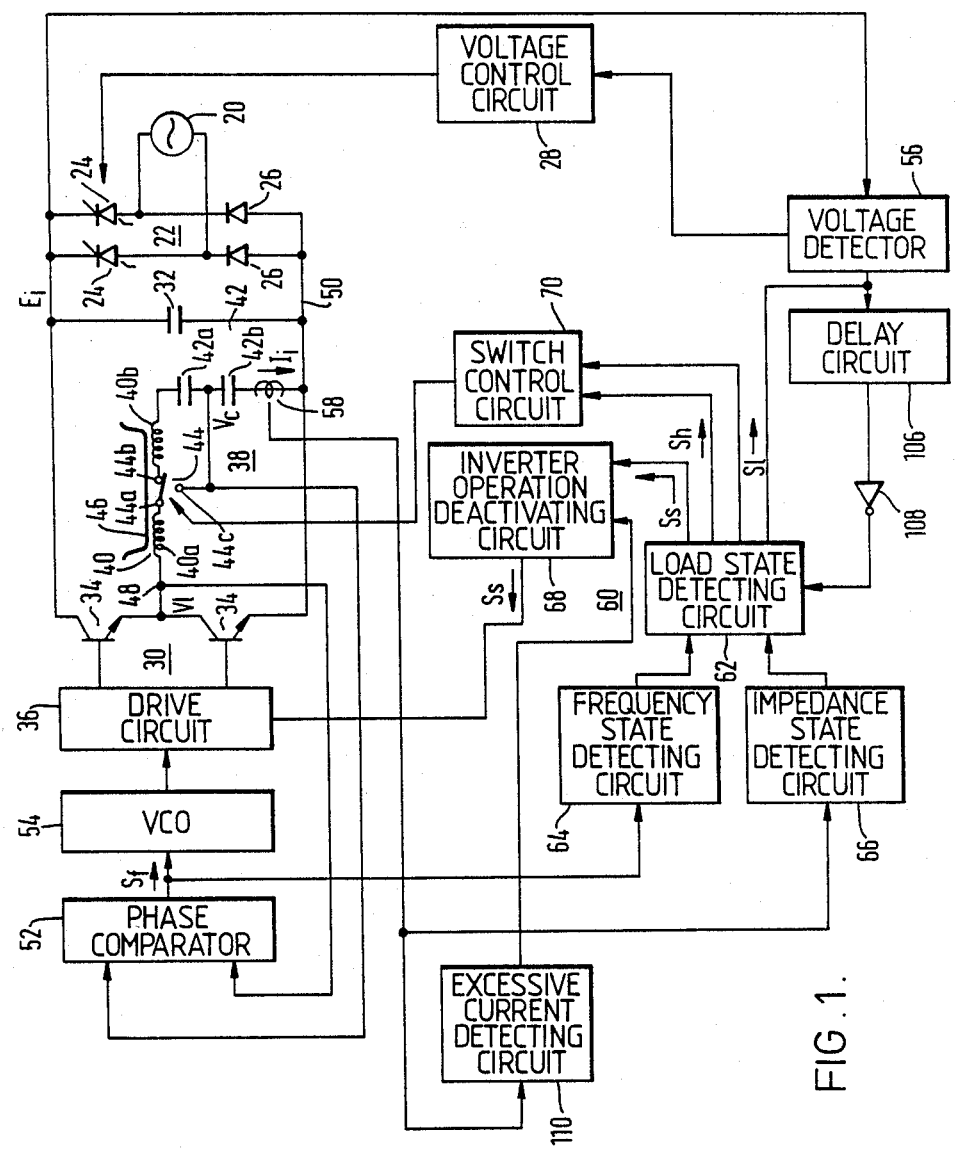
FIG. 1 is a block diagram showing a first embodiment of the induction heated cooking apparatus according to the present invention.

The present invention will now be described in detail with reference to the drawings, i e., FIGS. 1 through 10. Throughout the drawings, like or equivalent reference numerals or letters will be used to designate like or equivalent elements for simplicity of explanation.

Figure 2:
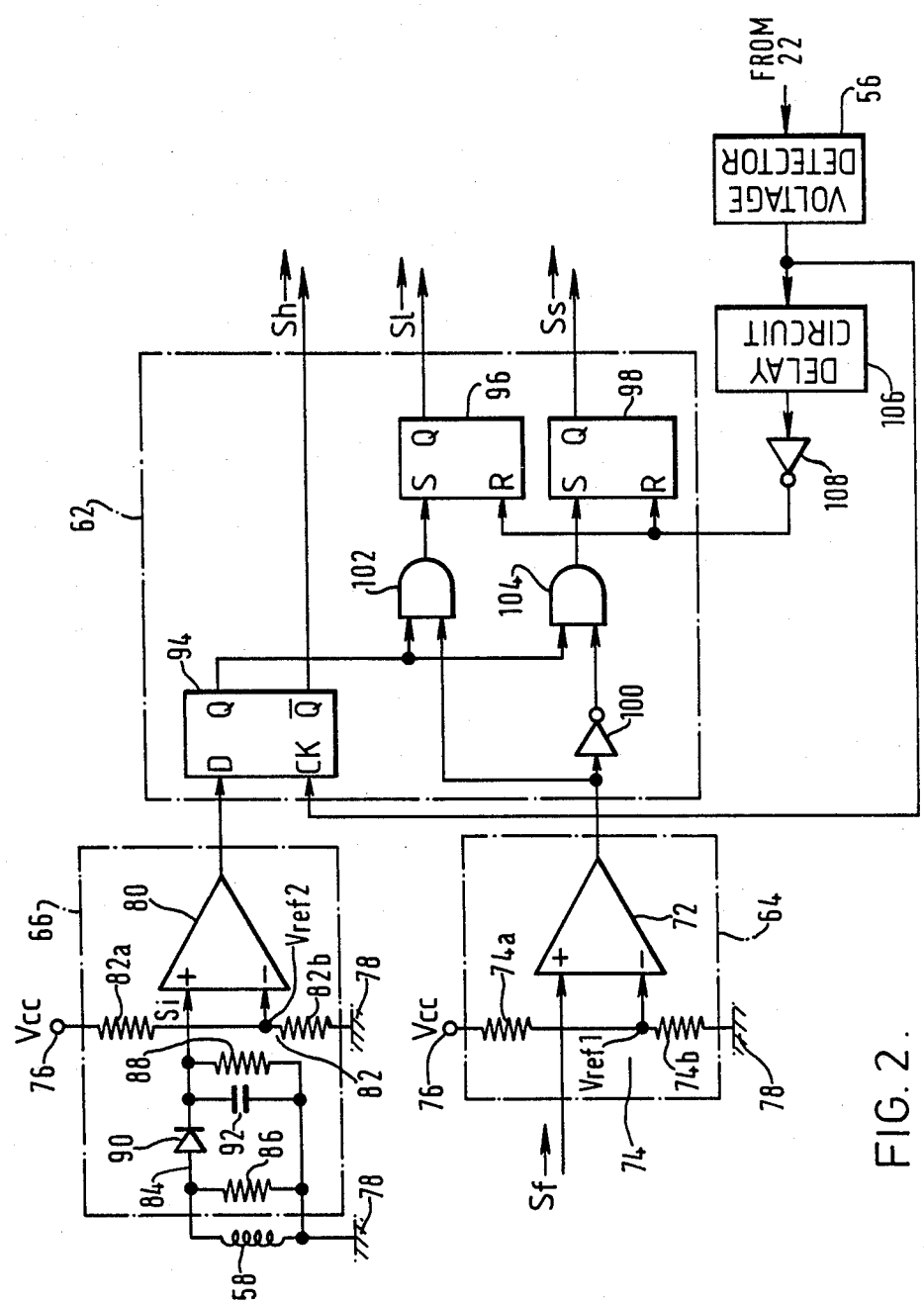
FIG. 2 is a circuit diagram of the principal block components of the embodiment of FIG. 1.
Figure 3:
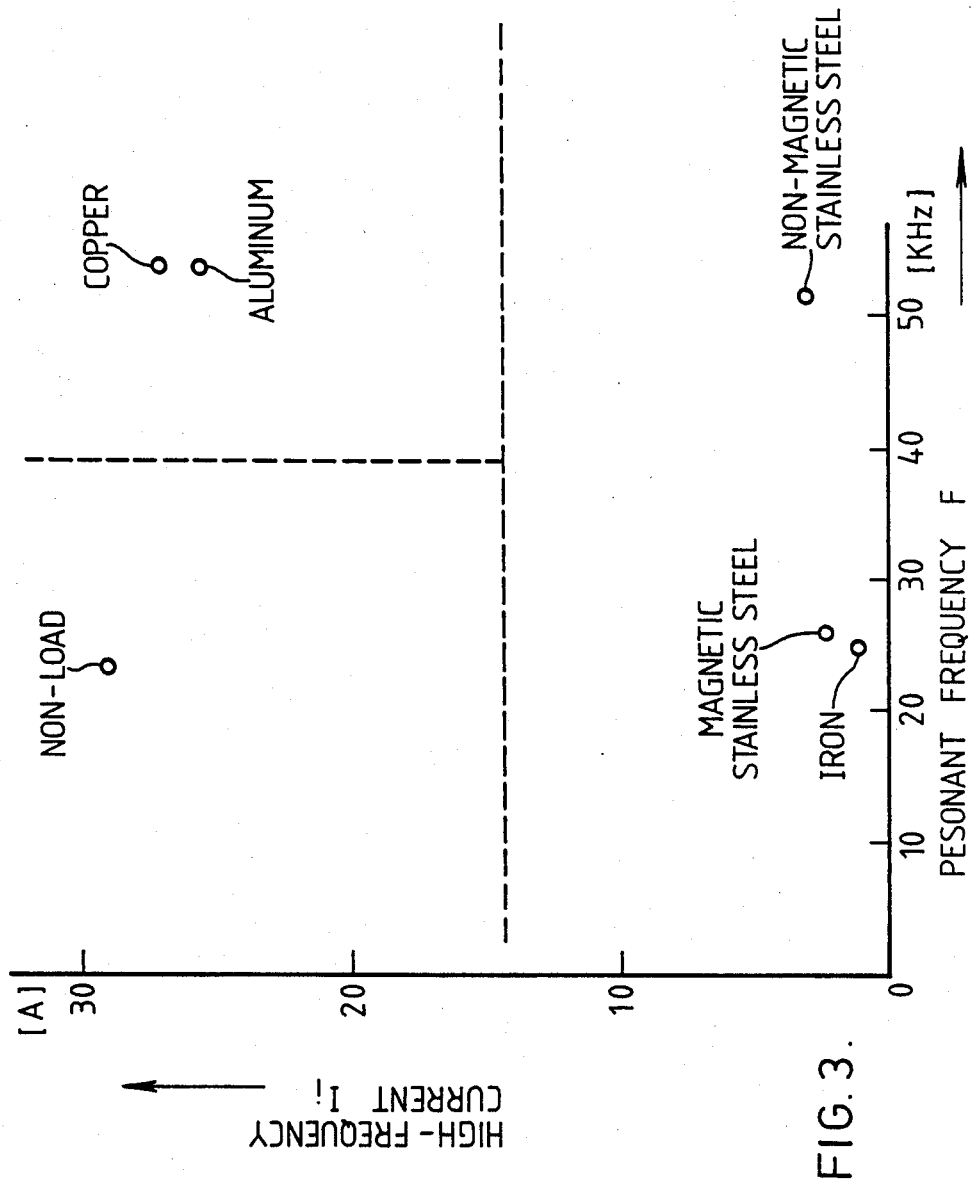
FIG. 3 is a graph showing the current to frequency characteristics of the resonant circuit of the embodiment of FIG. 1 for cooking vessels of different materials.

Referring now to FIGS. 1 to 3, a first embodiment of the induction heated cooking apparatus according to the present invention will be described in detail.

In FIG. 1, reference numeral 20 denotes a commercial AC power source. An AC current provided from commercial AC power source 20 is changed to a DC current by a rectifier 22 which is in the form of a bridge rectifier circuit comprised of a pair of thyristors 24 and a pair of diodes 26. Thyristors 24 are phase controlled by a voltage control circuit 28, which will be described later, so that the voltage of the DC current is regulated. The DC Current is supplied to a frequency inverter 30, after being smoothed by a smoothing circuit comprised of a capacitor 32. Frequency inverter 30 is comprised of a pair of switching transistors 34 and a drive circuit 36 for alternately activating switching transistors 34. The switching frequency for switching transistors 34 is servo controlled, as described later. An inverter output with a high-frequency current is supplied from frequency inverter 30 to a resonant circuit 38.

Resonant circuit 38 is comprised of an induction heating coil block 40, a resonant capacitor block 42 and a switch 44. Induction heating coil block 40 is disposed on a backside of a top plate (not shown) of the cooking apparatus. Induction heating coil block 40 applies a high frequency magnetic field induced by the high-frequency current to a cooking vessel, such as a pot or a pan 46, placed on the top plate. Thereby, an eddy-current is induced in the body of pan 46. The eddy-current generates heat in the body of pan 46 as an eddy-current loss due to the skin resistance of the body of pan 46. As a result, food contained in pan 46 is cooked by the heat.

Induction heating coil block 40 has a pair of coils 40a and 40b. Resonant capacitor block 42 has a pair of capacitors 42a and 42b. First coil 40a is coupled between an output terminal 48 of frequency inverter 30 and a movable contact 44a of switch 44. Second coil 40b is coupled between a first fixed contact 44b of switch 44 and a reference potential line 50 through a series circuit of first and second capacitors 42a and 42b. The connection node of first and second capacitors 42a and 42b is connected to second fixed contact 44c of switch 44.

In a practical example of the induction heated cooking apparatus designed with the inventors, first and second coils 40a, 40b were wound by about fifteen turns and sixty-five turns, respectively. First capacitor 42a connected to second coil 40b and second capacitor 42b connected to reference potential line 50 were 0.05 μF and 0.2 μF, respectively.

Output terminal 48 and second fixed contact 44c of switch 44 are connected to a phase comparator 52. Thus, phase comparator 52 compares the phases of potentials Vl and Vc on output terminal 48 and second fixed contact 44c, respectively. The phases of the potentials Vl and Vc correspond to phases Pl and Pc of inductive and capacitive currents Il and Ic, which flow through induction heating coil block 40 and resonant capacitor block 42, respectively.

Phase comparator 52 outputs a control signal Sf which varies in response to the difference between phases Pl and Pc. Control voltage Sf outputted from phase comparator 52 is applied to a voltage controlled oscillator (referred as VCO hereafter) 54, so that the oscillation frequency F of VCO 54 varies in response to control voltage Sf. The oscillation output of VCO 54 is supplied t drive circuit 36 of frequency inverter 30. Thus, phase comparator 52, VCO 54, frequency inverter 30 and resonant circuit 38 forms a loop circuit for a negative feedback servo control of the resonant frequency F of resonant circuit 38.

Phase comparator 52 outputs control signal Sf with a prescribed value, when phases Pl and Pc of inductive and capacitive currents Il and Ic are different by 90°. Control signal Sf with the prescribed value controls VCO 54 to oscillate at resonant frequency F of resonant circuit 38. When the phase difference between phases Pl and Pc shifts from 90°, control signal Sf controls VCO 54, so that the oscillation frequency of VCO 54 is servo controlled to resonant frequency F.

Rectifier 22 is coupled to a voltage detector 56 for detecting the voltage of the DC current output from rectifier 22 The voltage of the DC current detected by voltage detector 56 is applied to voltage control circuit 28. Voltage control circuit 28 phase controls the pair of thyristors 24, so that the voltage of the DC current supplied to frequency inverter 30 is servo controlled to a prescribed value.

The induction heated cooking apparatus is further provided with a current transformer 58 and an inverter operation control circuit 60. Current transformer 58 is provided to resonant circuit 38 for detecting the high-frequency current of resonant circuit 38. Inverter operation control circuit 60 is comprised of a load state detecting circuit 62, a frequency state detecting circuit 64, an impedance state detecting circuit 66, an inverter operation deactivating circuit 68 and a switch control circuit 70. Load state detecting circuit 62 is connected to phase comparator 52 and current transformer 58 through frequency state detecting circuit 64 and impedance state detecting circuit 66, respectively. Load state detecting circuit 62 generates three output signals, as described later, in response to outputs of frequency state detecting circuit 64 and impedance state detecting circuit 66.

One of the output signals generated from load state detecting circuit 62 is an inverter operation deactivating signal Ss, which is applied to inverter operation deactivating circuit 68. Inverter operation deactivating circuit 68 deactivates drive circuit 36 of frequency inverter 30 in response to inverter operation deactivating signal Ss, as described later. The other two output signals are a high resistance metal detecting signal Sh and a low resistance metal detecting signal Sl, which are applied to switch control circuit 70. Switch control circuit 70 controls switch 44 in response to high resistance metal detecting signal Sh and low resistance metal detecting signal SL, as described later.

When high resistance metal detecting signal Sh of high level is obtained from load state detecting circuit 62, switch control circuit 70 controls switch 44, so that movable contact 44a of switch 44 is connected to second fixed contact 44c thereof. When low resistance metal detecting signal Sl of the high level is obtained from load state detecting circuit 62, switch control circuit 70 controls switch 44, so that movable contact 44a of switch 44 is connected to first fixed contact 44b thereof.

Referring now to FIG. 2, the circuit construction and operation of inverter operation control circuit 60 will be described in detail.

Frequency state detecting circuit 64 is provided with a first voltage comparator 72 and a pair of resistors 74a and 74b. Resistors 74a and 74b form a series voltage divider 74 connected between a potential source 76 with a prescribed voltage Vcc and a ground potential terminal 78. Thus, the inversed input (−) of first voltage comparator 72 is supplied with a first reference potential Vref1 from the voltage divider. The non-inversed input (+) of first voltage comparator 72 is supplied with control signal Sf from phase comparator 2.

Control signal Sf is compared with first reference potential Vref1 of voltage divider 74 in first voltage comparator 72. Control signal Sf is proportional to resonant frequency F of resonant circuit 38 (see FIG. 1), as described above. When resonant frequency F increases enormously, control signal Sf exceeds first reference potential Vref1, so that frequency state detection circuit 64 outputs a high-level signal.

Impedance state detecting circuit 66 is provided with a second voltage comparator 80, a pair of resistors 82a and 82b and a rectifier circuit 84. Resistors 82a and 82b forms a series voltage divider 82 connected between potential source 76 and round potential terminal 78. Thus, the inversed input (−) of second voltage comparator 80 is supplied with a second reference potential Vref2 from voltage divider 82.

Rectifier circuit 84 is comprised of resistors 86 and 88, a diode 90 and a capacitor 92 Resistor 86 is connected between current transformer 58 (see FIG. 1) and ground potential terminal 78, so that resistor 86 converts the current detected by current transformer 58 to a voltage. Diode 90 is coupled to resistor 86 for rectifying the AC voltage on resistor 86. Resistor 88 and capacitor 92 form a smoothing circuit for the rectified DC voltage from diode 90. Thus, a detection output Si of current transformer 58 is applied to the non-inversed input (+) of second voltage comparator 80 as the DC voltage.

Detection output Si of the DC voltage is compared with second reference potential Vref2 in second voltage comparator 80. Detection output Si is inversely proportional to the input impedance of resonant circuit 38. Therefore, second voltage comparator 80 outputs a high-level signal when the input impedance of resonant circuit 38 is below a prescribed value corresponding to second reference potential Vref2.

Load state detecting circuit 62 is comprised of a D-type Flip-Flop 94, a pair of RS-type Flip-Flops 96 and 98, an inverter gate 100 and a pair of AND gates 102 and 104.

The data input terminal D of D-type Flip-Flop 94 is coupled to impedance state detecting circuit 66. The clock input terminal CK of D-type Flip-Flop 94 is coupled to voltage detector 56 (see FIG. 1). The non-inversed output terminal Q of D-type Flip-Flop 94 is coupled to one input terminal of each of AND gates 100 and 104. The inversed output terminal Q of D-type Flip-Flop 94 is coupled to switch control circuit 70 (see FIG. 1). Thus, the inversed output terminal Q of D-type Flip-Flop 94 outputs the high resistance metal detecting signal Sh.

Other input terminals of AND gates 102 and 104 are coupled to frequency state detecting circuit 64, directly and through inverter gate 100, respectively. The output terminals of AND gates 102 and 104 are coupled to the set terminals S of RS-type Flip-Flops 96 and B. The reset terminals R of RS-type Flip-Flops 96 and 98 are coupled to voltage detector 56 through a delay circuit 106 and an inverter gate 108 in series The non-inversed outputs Q of RS-type Flip-Flops 96 and 98 are coupled to switch control circuit 70 and inverter operation deactivating circuit 68, respectively (see FIG. 1). Thus, the non-inversed outputs Q of RS-type Flip-Flops 96 and 8 output low resistance metal detecting signal Sl and inverter operation deactivating signal Ss, respectively.

As described in detail afterward, D-type Flip-Flop 94 and RS-type Flip-Flop 96 respectively output high resistance metal detecting signal Sh and low resistance metal detecting signal Sl. RS-type Flip-Flop 98 outputs inverter operation deactivating signal Ss.

In the initial state at the time the power application from AC power source 20 to rectifier 22 and low resistance metal detecting signal Sl are received, switch control circuit 70 causes switch 44 to close the circuit between movable contact 44a and first fixed contact 44b, as shown in FIG. 1. When high resistance metal detecting signal Sh is received, switch control circuit 70 causes switch 44 to close the circuit between movable contact 44a and second fixed contact 44c. Inverter operation deactivating circuit 68 deactivates the operation of frequency inverter 30, when RS-type Flip-Flop 98 outputs inverter operation deactivating signal Ss.

Voltage detector 56 detects the voltage of the power source supplied from rectifier 22. The output voltage of frequency inverter 30 corresponds to the voltage of the power source. Therefore, when the output voltage of frequency inverter 30 reaches a prescribed level, voltage detector 56 supplies the clock terminal CK of D-type Flip-Flop 94 with a read pulse. D-type Flip-Flop 94 reads the output of impedance state detecting circuit 66 in response to the read pulse. The read pulse is also supplied to delay circuit 106. In the initial state, the reset terminals R of respective RS-type Flip-Flops 96, 98 are set &0 the high level, so that the non-inversed output terminals Q thereof are the low level. The output state of D-type Flip-Flop 94 is settled before a prescribed delay time has elapsed in delay circuit 106. Then, delay circuit 106 supplies a reset signal to RS-type Flip-Flops 96 and 98 through inverter gate 186. The reset terminals R are set to the low level by the inversed output of delay circuit 106. Then the set terminal S of respective RS-type Flip-Flops 96, 98 is supplied with a high-level pulse and the non-inversed output terminal Q is set at a high level.

The induction heated cooking apparatus is further provided with an excessive current detecting circuit 110 between current transformer 58 and inverter operation deactivating circuit 68. Excessive current detecting circuit 110 also controls inverter operation deactivating circuit 68 to immediately deactivate the operation of frequency inverter 30 when the frequency inverter current exceeds a prescribed level.

Switch control circuit 70 controls switch 44 to provide a state where coils 40a and 40b and resonant capacitors 42a and 42b of resonant circuit 38 come to be effective, or a state where first coil 40a and second resonant capacitor 42b are effective and the winding turns of the coil and its capacity are changed. The former state is suitable for heated cooking vessel 46 made of aluminum or copper (hereinafter referred to as "low resistance metal heating condition") and the latter for heated cooking vessel 46 of iron or stainless steel (hereinafter referred to as "high resistance metal heating condition").

Now, the operations of the present embodiment will be described below.

First, the relation between the non-load state and the output current and resonant frequency F of the Frequency inverter 30 will be disclosed. FIG. 3 shows the results of output current Ii of frequency inverter 30 and resonant frequency F measured when the material of cooking vessel 46 is iron, magnetic stainless steel, non-magnetic stainless steel, copper, or aluminum, and at the time of the non-load state, where switch 44 sets the circuit between movable contact 44a and first fixed contact 44b to the closed state and in the low resistance metal heating condition. As indicated in FIG. 3, when cooking vessel 46 is made of a resistance metal such as aluminum or copper (including the non-load state state), it is distinguished from the case of a high resistance metal such as iron or stainless steel, according to the magnitude of the impedance current. The case of the non-load state is distinguished from the case of the cooking vessel of a low resistance metal such as copper or aluminum, according to the level of resonant frequency F. This means that the body material of cooking vessel 46 and the presence of cooking vessel 46 are effected by output current Ii of frequency inverter 30 (namely, the impedance of resonant circuit 38) and resonant frequency F. The present invention pays attention to the above. The function of the present embodiment will be described with reference to the case of a cooking vessel 46 of each material, as described above.

(1) Heating operation of iron, magnetic or non-magnetic stainless steel vessel:

Under a low resistance metal heating condition where switch 44 causes the circuit between movable contact 44a and first fixed contact 44b to be closed, VCO 54 starts the load state judging operation with the output voltage to frequency inverter 3 at a prescribed low level. When this output voltage reaches a prescribed level, voltage detector 56 detects it and the read pulse is supplied t load state detecting circuit 62 therefrom, resulting in the reading of the signal from impedance state detecting circuit 66 into D-type Flip-Flop 94. In this case, since iron or the like has a high inherent resistance, the input impedance of resonant circuit 38 is increased and output current Ii of frequency inverter 30 is lowered, as is obvious from FIG. 3. Consequently, the output terminal of second comparator 80 of impedance state detecting circuit 66 is at a low level and the non-inversed output terminal Q of D-type Flip-Flop 94 is at a low level, outputting the high resistance metal detecting signal Sh at a high level from the inversion non-inversed output terminal Q. At the time, since the non-inversed output terminal Q of D-type Flip-Flop 94 is at a low level and each output from AND gates 96 and 98 is retained lo, low resistance metal detecting signal Sl and inverter operation deactivating signal Ss are not output.

As a result, switch 44 sets the circuit between movable contact 44a and second fixed contact 44c closed by switch control circuit 70, and resonant circuit 38 is set in the high resistance metal heating condition where first coil 40a and second resonant capacitor 42b alone are available. Under this condition, VCO 54 increases the output voltage of frequency inverter 30 to heat cooking vessel 46. Since frequency inverter 30 is controlled to be in a resonance state at all times by the frequency servo control loop, comprised of phase comparator 52 and VCO 54 the output frequency of frequency inverter 30 is relatively low at about 25 KHz.

Then, when cooking vessel 46 is removed from the top plate, the input impedance of first coil 40a is sharply lowered, abruptly increasing output current Ii of frequency inverter 30, causing an excessive current detecting circuit 110 to deactivate the operation of frequency inverter 30.

(2) Heating operation of aluminum or copper vessel:

As described above, when the load state judging operation is effected under the low resistance metal heating condition, since aluminum or the like has a small inherent resistance, the input impedance of resonant circuit 38 is small and output current Ii of frequency inverter 30 is high (see FIG. 3). Conversely to the above heating of iron or the like, the output terminal of second comparator 80 of the impedance detecting means is at a high level and the output terminal Q of D-type Flip-Flop 94 is at a high level and the inversed output terminal Q is at a low level. At the time of heating aluminum or the like, resonant frequency F is as high as about 50 KHz, as shown in FIG. 3, and, therefore, the output terminal of first comparator 72 of frequency state detecting circuit is at high level. Consequently the output of the AND gate 31 becomes high and the low resistance metal detecting signal Sl is output from the non-inversed output terminal Q of RS-type Flip-Flop 96. However, since switch 44 has already set the circuit between movable contact 44a and first fixed contact 44b in the closed state, switch 44 is not turned over and VCO 54 increases the output voltage of frequency inverter 30 to effect the ordinary heating.

If cooking vessel 46 is removed from the top plate in this state, the non-inversed output terminal Q of D-type Flip-Flop 94 of load state detecting circuit 62 retains the high level with, which the read pulse was received at the time of a low voltage. At the time, since resonant frequency F is lowered due to the inductance change of induction heating coil block 40 (see FIG. ), a low-level signal is output from first comparator 72 of frequency state detecting circuit 64. This signal is inversed by inverter gate 100 and supplied to RS-type Flip-Flop 98. The non-inversed output terminal Q of RS-type Flip-Flop 98 outputs inverter operation deactivating signal Ss of the high level to inverter operation deactivating circuit 68 Thus, the output of inverter operation deactivating signal Ss from load state detecting circuit 62 deactivates the operation of frequency inverter 30 immediately.

(3) Heating operation in the non-load state:

As obvious from the above description when the load state judging operation is effected under the low resistance metal heating condition, the input impedance of resonant circuit 38 alone serve to make the input impedance low, and output current Ii of frequency inverter 30 is increased (see FIG. 3). Therefore, the output terminal of second comparator 80 of impedance state detecting circuit 66 comes to be at a high level, the non-inversed output terminal Q of D-type Flip-Flop 94 is high and the inversion non-inversed output terminal Q is low. On the other hand when the non-load state is applied, resonant frequency F is low at a level of about 20 KHz and the output terminal of first comparator 70 of frequency state detecting circuit 64 is low. Accordingly, the output of AND gate 104 is high and the output terminal of RS-type Flip-Flop 98 outputs inverter operation deactivating signal Ss of the high level to inverter operation deactivating circuit 68. Then, inverter operation deactivating signal Ss is output from load state detecting circuit 62 to deactivate the operation of frequency inverter 30 immediately.

As described above, in this embodiment the input impedance (frequency inverter current at a constant voltage) of resonant circuit 38 and resonant frequency F both constitute the judging elements. Accordingly, the following effects are provided. The input impedance can surely distinguish between the case of a low resistance metal, such as copper or aluminum and the non-load state state, and the case of a high resistance metal, such as iron, magnetic stainless steel, or non-magnetic stainless steel. In the case of cooking vessel 46 made of a low resistance metal, such as copper or aluminum, the input impedance of the induction heating coil does not show a large difference between the cases of heating and the non-load state. Therefore the distinction between them, which was difficult previously, Can be effected accurately by utilizing the difference of the resonant frequencies. Thus, many kinds of materials can be correctly distinguished and the heating conditions can be switched according to the body material used. The application of the induction heated cooking apparatus can be expanded greatly.

Figure 4:
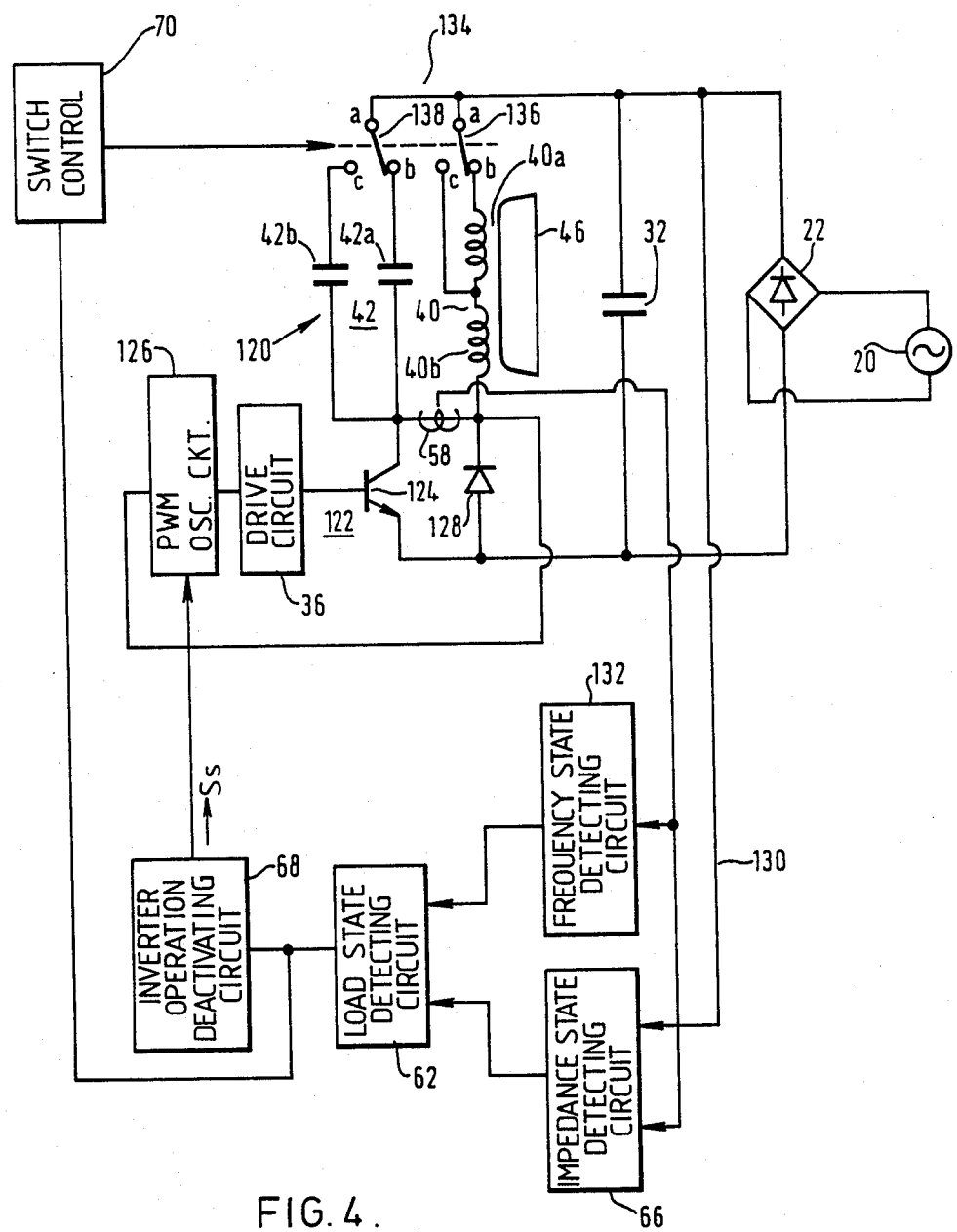
FIG. 4 is a block diagram showing a modification of the first embodiment of the induction heated cooking apparatus.

Referring now to FIG. 4, a modification of the first embodiment of the induction heated cooking apparatus according to the present invention will be described. The modified induction heated cooking apparatus of FIG. 4 is different from the aforementioned first embodiment of the induction heated Cooking apparatus shown in FIG. in the following respects, i.e., the frequency inverter and the frequency state detecting circuit. Other portions are the same as those of the first embodiment. Therefore, the description of the modified induction heated cooking apparatus of FIG. 4 will focus mainly on the different portions. The same reference numerals are used as in the first embodiment.

A resonant circuit 120 is constituted of a parallel resonant circuit in, which induction heating coil block 40 and resonant capacitor block 42 are coupled to frequency inverter 122 in parallel with each other In induction heating coil block 40, first and second coils 40a and 40b are connected in series. However, in resonant capacitor block 42, first and second resonant capacitors 42a and 42b are connected in parallel. The power source from rectifier 22 of the type of bridge rectifier circuit is smoothed by smoothing circuit capacitor 32 and applied to a series circuit of a switching transistor 124 and resonant circuit 110. Switching transistor 124 constitutes frequency inverter 122 together with drive circuit 36. The input terminal of frequency inverter 122 is coupled to a pulse width modulation (referred as PWM hereafter) type oscillation circuit 126. PWM type oscillation circuit 126 is coupled to the output terminal of frequency inverter 122 for receiving the inverter output current The oscillation output of PWM type oscillation circuit 126 is applied to frequency inverter 122, so that frequency inverter 122 supplies the inverter output with the oscillation frequency. Frequency inverter 122 and PWM type oscillation circuit 126 form a servo control loop for the frequency, so that the frequency of the inverter output is automatically servo controlled to the resonant frequency of resonant circuit 120.

Resonant circuit 120 is provided with a current transformer 53. The detection output of current transformer 53 is supplied to an inverter operation control circuit 130. Inverter operation control circuit 130 is comprised of load state detecting circuit 62, a frequency state detecting Circuit 132, impedance state detecting circuit 66, an inverter operation deactivating circuit 68 and switch control circuit 70. Load state detecting circuit 62 is connected to current transformer 58 through frequency state detecting circuit 132 and impedance state detecting circuit 64 for receiving the detection output o current transformer 58. The output of load state detecting circuit 62 is supplied to inverter operation deactivating circuit 68 and switch control circuit 70. Inverter operation deactivating circuit 68 and switch control circuit 70 are coupled to PWM type oscillation circuit 126 and a switch 134.

Switch 134 includes two switch units 136 and 138, which are interlocked to each other and coupled to induction heating coil block 40 and resonant capacitor block 42, respectively. First and second coils 40a and 40b of induction heating coil block 40 are coupled to first and second fixed contacts 136b and 136c of switch unit 136. The movable contact 136a of switch unit 136 is coupled to rectifier 22. First and second resonant capacitors 42a and 42b of resonant capacitor block 42 are coupled to first and second fixed contacts 138b and 138c of switch unit 138. The movable contact 138a of switch unit 138 is coupled to rectifier 22. Both switch units 136 and 138 are controlled by switch control circuit 70, as described later.

Load state detecting circuit 62 generates two output signals, as described later, in response to outputs of frequency state detecting circuit 132 and impedance state detecting circuit 66.

One of the control signals generated from load state detection circuit 62 is the inverter operation deactivating signal Ss, which is applied to inverter operation control circuit 68. Inverter operation control circuit 68 deactivates PWM type oscillation circuit 126 in response to inverter operation deactivating signal Ss. Another control signal is resistance state detecting signal Sr, which is applied to switch control circuit 68. Switch control circuit 68 controls switch 134 in response to resistance state detecting signal Sr, as described later.

Figure 5:
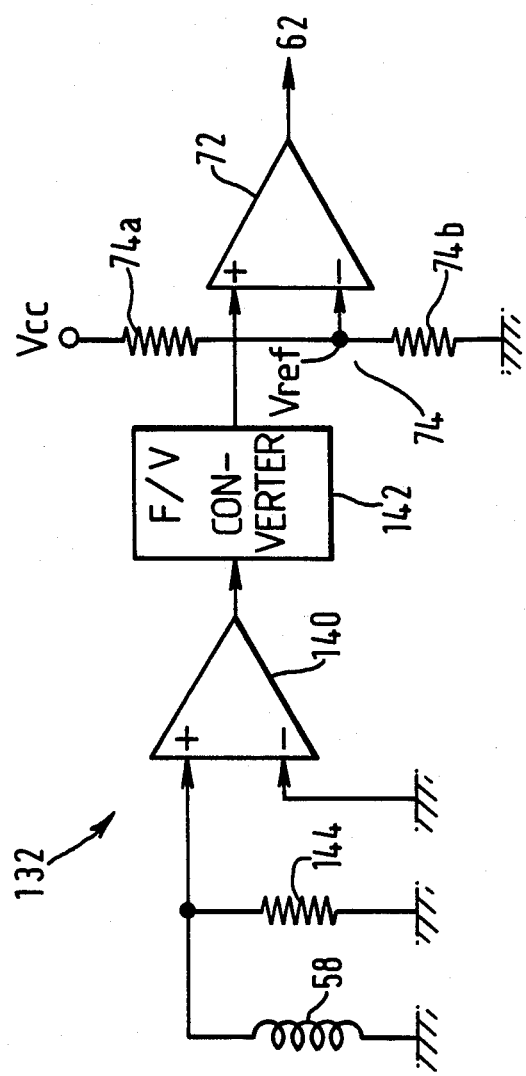
FIG. 5 is a circuit diagram showing the frequency detecting circuit of the modification of FIG. 4.

Frequency state detecting circuit 132 is configured as shown in FIG. 5. Frequency state detecting circuit 132 is provided with an operational amplifier 140, a frequency to voltage converter (referred as F/V converter hereafter) 142, voltage comparator 72 and a pair of resistors 74a and 74b. The non-inversed input terminal (+) of operational amplifier 140 is coupled to current transformer 58, and the inversed input terminal (−) of operational amplifier 140 is coupled to ground potential terminal 78. The output terminal of operational amplifier 140 is coupled to the non-inversed input terminal (+) of voltage comparator 72 through F/V converter 142. Resistors 74a and 74b forms series voltage divider 74 connected between potential source 76 (with prescribed voltage Vcc) end round potential terminal 78. Thus, the inversed input (−) of voltage comparator 72 is supplied with reference potential Vref from the voltage divider.

A high-frequency current flowing through resonant circuit 110 is detected by current transformer 58. The detected output of current transformer 58 is converted to a voltage signal by resistor 144. The voltage signal obtained by resistor 144 is shaped to a square waveform by operational amplifier 140. The square waveform signal output from operational amplifier 140 is synchronized with resonant frequency F of resonant circuit 120. The frequency is converted to a DC voltage signal by F/V converter 142 and compared with reference voltage Vref of the voltage divider by voltage comparator 72. Therefore, voltage comparator 72 outputs a high-level signal when resonant frequency F exceeds a prescribed value, which corresponds to reference voltage Vref. Thus frequency state detecting circuit 132 functions in the same manner as frequency state detecting circuit 64 of the first embodiment. It is needless to say that the above structure has the same effects as the above first embodiment.

Further, the present invention is not restricted to the embodiments as described in above and shown in the drawings. For example, the input impedance of the induction heating coil may be detected by retaining output current Ii of frequency inverter 30 at a prescribed level and measuring the voltage. Alternatively, when output current Ii of frequency inverter 30 and power source voltage Ei for frequency inverter 30 vary, they may be measured and calculated to detect the input impedance. Further, the load state judging means or the like may be configured by a micro computer or a ate array. In the present invention, the body material of cooking vessel 46 is judged in view of the input impedance and resonant frequency F of the induction heating coil, and heating may be effected according to the inherent resistance and resonant frequency F of resonant circuit 38. Thus, the present invention can be applied not only to cooking vessels of the above materials, but also to cooking vessels of many other kinds of materials.

As described above, the first embodiment of the present invention controls the apparatus by detecting input impedance Z and resonant frequency F of resonant circuit 38. Consequently, it can judge cooking vessels of various kinds correctly and provide a suitable heating regardless of the body material of cooking vessel 46 or detect the presence of a vessel correctly. Thus, the first embodiment of the present invention provides excellent effects.

Figure 6:
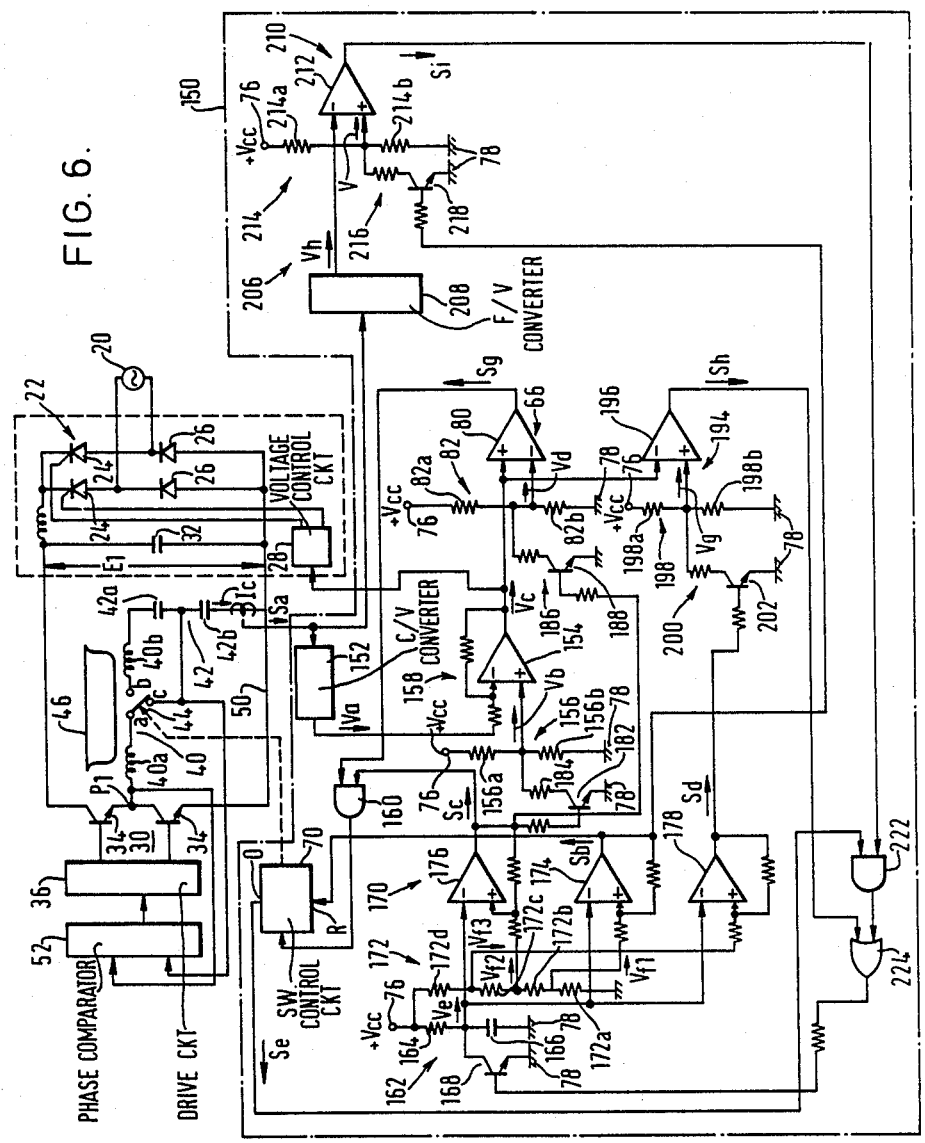
FIG. 6 is a block diagram showing a second embodiment of the induction heated cooking apparatus.
Figure 7:
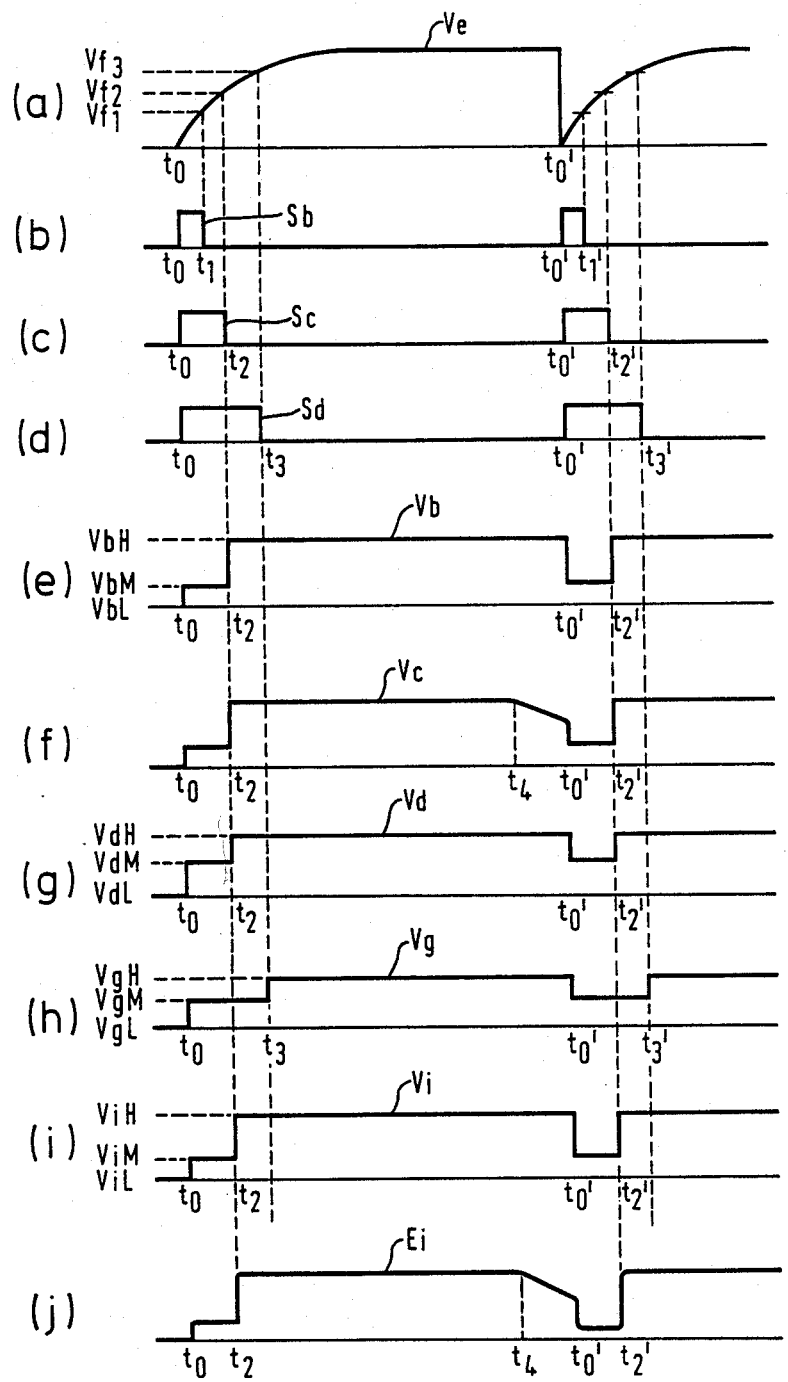
FIG. 7 is a graph showing signals or voltages in the induction heated cooking apparatus of the embodiment of FIG. 6.

Referring no to FIGS. 6 and 7, second embodiment of the induction heated cooking apparatus according to the present invention will be described in detail. The second embodiment of induction heated cooking apparatus is different from the aforementioned first embodiment of the induction heated cooking apparatus in the inverter operation control circuit. Other portions are the same as those of the first embodiment. Therefore, only the different portions of the second embodiment of the induction heated cooking apparatus will be described. The same reference numerals are used for parts appearing in first embodiment.

In FIGS. 6, the induction heated cooking apparatus is provided with current transformer 58 and an inverter operation control circuit 150. Current transformer 58 is provided in resonant circuit 38 for detecting the high-frequency current of resonant circuit 38.

A current to voltage converter 152 in inverter operation control circuit 150 is coupled to current transformer 58. Current to voltage converter 152 converts an AC current signal Sa detected by current transformer 58 to a DC voltage signal Va. The voltage signal Va is therefore proportional to a high-frequency current Ic flowing through resonant circuit 38. Voltage signal Va is supplied to the inversed input terminal (−) of a differential amplifier 154. The non-inversed input terminal (+) of differential amplifier 154 is supplied with a reference voltage Vb from a voltage divider 156. Voltage divider 156 is comprised of a pair of resistors 156a and 156b respectively connected to potential source 76 with prescribed voltage Vcc and ground potential terminal 78.

Differential amplifier 154 outputs a control signal Vc, which is the difference between voltage signal Va and reference voltage Vb. Control signal Vc is supplied to voltage control circuit 28 for controlling thyristors 24 in rectifier 22 Therefore, current transformer 58, current to voltage converter 152, differential amplifier 154 and voltage control circuit 28 form a feedback servo loop 158 for the voltage Ei of the DO power source supplied from rectifier 22. Voltage Ei of the DC power source increases or decreases when voltage signal Va obtained by current to voltage converter 152 decreases or increases. Control signal Vc corresponds to an error signal in feedback servo loop 158 for controlling voltage Ei of the DC power source. Thus, control signal Vc is proportional to voltage Ei of the DC power source.

Control signal V is further supplied to the non-inversed input terminal (+) of voltage comparator 80 in impedance state detecting circuit 66. The inversed input terminal (−) of voltage comparator 80 is supplied with a reference voltage Vd from voltage divider 82. Voltage divider 82 is comprised of resistors 82a and 82b, respectively connected to potential source 76 and ground potential terminal 78. Voltage comparator 80 and voltage divider 82 constitute impedance state detecting circuit 66.

Impedance state detecting circuit 66 outputs a detection signal S of high level when control signal Vc, supplied from differential amplifier 154 in feedback servo loop 158, is higher than reference voltage Vd. On other occasions, impedance state detecting circuit 66 outputs detection signal Sg of low level signal.

Detection signal S output from impedance state detecting circuit 66 is applied to switch control circuit 70 through an AND ate 160. Switch control circuit 70 controls switch 44 in response to detection signal Sg output of impedance state detecting circuit 66. When detection signal Sg of high level is obtained from impedance state detecting circuit 66, switch control circuit 70 controls switch 44 so that movable contact 44a of switch 44 is connected to first fixed contact 44b thereof. When detection signal Sg of low level is obtained from impedance state detecting circuit 66, switch control circuit 70 controls switch 44, so that movable contact 44a of switch 44 is connected to second fixed contact 44c thereof.

Switch control circuit 70 is further provided with a reset terminal R. Switch control circuit 70 controls switch 44 in response to a signal applied to reset terminal R, as described later. When the signal of high level is applied to reset terminal R. switch control circuit 70 controls switch 44, so that movable contact 44a of switch 44 is connected to first fixed contact 44b thereof. Further, switch control circuit 70 outputs a control signal Se of high level from its output terminal 0 when control signal Se of high level is applied to reset terminal R. This occurs when movable contact 44a of switch 44 is connected to first fixed contact 44b thereof.

Inverter operation control circuit 150 is further provided with a pulsating voltage generating circuit 162. Pulsating voltage generating circuit 162 is comprised of a resistor 164, a capacitor 166 and a transistor 168. Resistor 164 and capacitor 166 are connected between potential source 76 and ground potential terminal 78, so that capacitor 166 is charged with the potential of potential terminal 78. Transistor 168 is connected in parallel with capacitor 166. Transistor 168 activates, or deactivates as described later, so that the output Ve of pulsating voltage generating circuit 162, i.e., the charge potential of capacitor 166, pulsates in response to the operation of transistor 168 and varies as shown in FIG. 7(a). Pulsating voltage Ve immediately becomes zero when transistor 168 is activated. When transistor 168 is deactivated, pulsating voltage Ve gradually rises, as shown in FIG. (a). Here, it is assumed that pulsating voltage Ve takes values the same as reference voltages Vf1, Vf2 and Vf3, as described later, at times t1, t2 and t3. Pulsating voltage Ve is supplied to an inverter operation initializing circuit 170.

Inverter operation initializing circuit 170 includes a series voltage divider 172 and three voltage comparators 174, 176 and 178. In voltage divider 172, four resistors 172a, 172b, 172c and 174d are connected in series between potential source 76 and ground potential terminal 78. Thus, voltage divider 172 provides three different reference voltages Vf1, Vf2 and Vf3 ( Vf1<Vf2<Vf3), as described above. Reference voltages Vf1, Vf2 and Vf3 are applied to the non-inversed input terminals (+) of voltage comparators 174, 176 and 178, respectively. The inversed input terminals (−) of voltage comparators 174, 176 and 178 are coupled in common to pulsating voltage generating circuit 162 for receiving pulsating voltage Ve.

Voltage comparators 174 in inverter operation initializing circuit 170 initialize switch control circuit 70 when an output Sb of high level is obtained on its output terminal. Output Sb varies as shown in FIG. 7(b). Voltage comparators 174 supply reset terminal R of switch control circuit 70 with the high level signal Sb when pulsating voltage Ve is lower than reference voltage Vf1 (Ve< Vf1). On other occasions (Ve≧Vf1), output signal Sb is low level.

Voltage comparators 176 in inverter operation initializing circuit 170 initialize differential amplifier 154 in feedback servo control loop 158 through a voltage lowering circuit 180 when an output Sc of high level is obtained on its output terminal. Output Sc varies as shown in FIG. 7(c). Voltage lowering circuit 180 is comprised of a transistor 182, which is coupled in parallel with resistor 156b of voltage divider 156 through a collector resistor 184. Voltage comparator 176 supplies the base of transistor 182 with the high level signal Sc when pulsating voltage Ve is lower than reference voltage Vf2 (Ve<Vf2). On other occasions (Ve≧Vf2), output signal Sc is low level. When transistor 182 is activated by output Sc of high level, collector resistor 184 is effectively connected in parallel to resistor 156b of voltage divider 156. As a result, reference voltage Vb lowers as shown in FIG. 7(e) during time t0 to time t2.

Voltage comparators 176 in inverter operation initializing circuit 170 further initialize impedance state detecting circuit 66 through a voltage lowering circuit 186 when output Sc of high level is obtained on its output terminal. Voltage lowering circuit 186 is comprised of a transistor 188, which is coupled in parallel with resistor 82b of voltage divider 82 through a collector resistor 190. Voltage comparator 176 supplies also the base of transistor 188 with the high level signal Sc when pulsating voltage Ve is lower than reference voltage Vf2 (Ve<Vf2). When transistor 158 is activated by output Sc of high level, collector resistor 190 is effectively connected in parallel to resistor 82b of voltage divider 82. As a result, reference voltage Vd lowers as shown in FIG. 7(g) during time t0 to time t2.

Output Sc from voltage comparator 176 further is applied to AND ate 160. Therefore. AND gate 160 allows the supply of the high level signal output from impedance state detecting circuit 66 to switch control circuit 70 when output Sc of voltage comparator 176 is high level.

Inverter operation control circuit 150 is further provided with a first non-load state detecting circuit 194. First non-load state detecting circuit 194 is comprised of a voltage comparator 196 and a voltage divider 198.

Voltage divider 198 is comprised of resistors 198a and 198b, respectively connected to potential source 76 and ground potential terminal 78. Thus, voltage divider 198 supplies the non-inversed input terminal (+) of voltage comparator 196 with a reference voltage Vg. The inversed input terminal (−) of voltage comparator 196 is coupled to voltage comparator 154 in feedback servo control loop 158 for receiving control signal Vc. First non-load state detecting circuit 194 outputs a detection signal Sh of high level when control signal Vc is lower than reference voltage Vg (Vc<Vg). On other occasions (Vc≧Vg), detection signal Sh is low level.

Voltage comparators 178 in inverter operation initializing circuit 170 initialize first non-load state detecting circuit 194 through a voltage lowering circuit 200 when an output signal Sd of high level is obtained on its output terminal. Output Sd varies, as shown in FIG. 7(d).

Voltage lowering circuit 200 is comprised of a transistor 202, which is coupled in parallel with resistor 198b of voltage divider 198 through a collector resistor 204. Voltage comparators 178 supply the base of transistor 202 with the high level signal Sd when pulsating voltage Ve is lower than reference voltage Vf3 (Ve<Vf3). On other occasions (Ve≧Vf3), output signal Sd is low level. When transistor 202 is activated by output Sd of high level, collector resistor 204 is effectively connected in parallel to resistor 198b of voltage divider 198. As a result, reference voltage Vg lowers as shown in FIG. 7(h) during time t0 to time t3.

Inverter operation control circuit 150 is further provided with a frequency state detecting circuit 206. Frequency state detecting circuit 206 is comprised of an F/V converter 208 and a second non-load state detecting circuit 210. F/V converter 208 is coupled to current transformer 58 for receiving AC current signal Sa detected by current transformer 58. F/V converter 208 converts the frequency of AC current signal Sa to a voltage signal Vh. Second non-load state detecting circuit 210 is comprised of a voltage comparator 212 and a voltage divider 214. Voltage divider 214 is comprised of resistors 214a and 214b, respectively connected to potential source 76 and ground potential terminal 78. Thus, voltage divider 214 supplies the non-inversed input terminal (+) of voltage comparator 212 with a reference voltage Vi. The inversed input terminal (−) of voltage comparator 212 is coupled to F/V converter 208 for receiving voltage signal Vh.

Voltage comparator 212 outputs a detection signal Si of high level when control signal Vh is lower than reference voltage Vi (Vh<Vi). On other occasions (Vh≧Vi), detection signal Si is low level.

Voltage comparator 174 in inverter operation initializing circuit 170 further initialize second non-load state detecting circuit 210 through a voltage lowering circuit 216 when an output signal Sb of high level is obtained on its output terminal. Voltage lowering circuit 216 is comprised of a transistor 218, which is coupled in parallel with resistor 214b of voltage divider 214 through a collector resistor 220. Voltage comparator 174 supplies the base of transistor 218 with the high level signal Sb when pulsating Voltage Ve is lower than reference voltage Vf1 (Ve<Vf1). When transistor 218 is activated by output Sb of high level, collector resistor 220 is effectively connected in parallel to resistor 214b of voltage divider 214. As a result, reference voltage Vi lowers, as shown in FIG. 7(i), during time t0 to time t1.

Detection signal Si output from second non-load state detecting circuit 21 and control signal Se output from output terminal 0 of switch control circuit 70 are applied to AND gate 222. Thus, AND gate 222 operates the AND logic between Detection signal Si and control signal Se. AND logic signal Sj obtained by AND gate 222 is applied to an OR gate 224. OR gate 224 is also applied with detection signal Sh output from first non-load state detecting circuit 194. OR logic signal obtained by OR gate 224 is applied to the base of transistor 168 in pulsating voltage generating circuit 162. Therefore, transistor 168 is activated by either of detection signal Sh or AND logic signal Sj, so that pulsating voltage Ve obtained by pulsating voltage generating circuit 162 becomes to zero.

Referring now to FIG. 7, the operation of the second embodiment of the induction heated cooking apparatus according to the present invention will be described.

Here, it is assumed that a charge for capacitor 166 in pulsating voltage generating circuit 162 starts at time t0, as shown in FIG. 7(a). Then, pulsating voltage Ve gradually rises, as shown in the drawing. The charge operation characteristic for capacitor 166 is given by the time constant provided by the resistance of resistor 164 and the capacitance of capacitor 166.

When pulsating voltage Ve exceeds a value the same as reference voltage Vf3 at time t3, voltage comparator 178 in inverter operation initializing circuit 170 outputs signal Sd of low level. Since pulsating voltage Ve is higher than reference voltage Vf3 after time t3. Signal Sd of low level is applied to transistor 202 in voltage lowering circuit 200 so that transistor 202 is deactivated. Reference voltage Vg of voltage divider 198 rises to its prescribed higher voltage VgH, as shown in the drawing, from its prescribed middle voltage VgM (VgH>VcN−L>VgM), where VcN−L represents the value of control signal Vc output from differential amplifier 154 in a non-load state of the apparatus. Voltage comparator 196 in first non-load state detecting circuit 194 then outputs detection signal Sh of high level. Detection signal Sh of high level is applied to the base of transistor 168, so that transistor 168 is activated.

Movable contact 44a of switch 44 is connected to first fixed contact 44b at that time, when the apparatus is set to the operation state for heating an aluminum or copper pan. Aluminum and copper have a relatively small skin resistance against the frequency of high-frequency current Ic flowing through resonant circuit 38 as compared to iron or magnetic stainless steel. In this operation state, input impedance Z of resonant circuit 38 is very low, as described above.

Resonant circuit 38 also has input impedance Z of low value in the non-load state. The value of input impedance Z in the non-load state is close to the input impedance in the heating operation for an aluminum or copper pan. Therefore, if pan 46 made of aluminum or copper is removed from a top plate (not shown) of the apparatus, first non-load state detecting circuit 194 fails to detect the removal of pan 46. This is because first non-load state detecting circuit 194 operates in response to a change which is proportional to input impedance Z of resonant circuit 38.

In this case, however, the frequency of high-frequency current Ic lowers abruptly. In response to the frequency change, voltage signal Vh obtained by F/V converter 208 in frequency state detecting circuit 206 is lower than reference voltage Vi from voltage divider 214. Voltage comparator 212 in second non-load state detection circuit 210 outputs detection signal Si of high level That is, frequency state detecting circuit 206 operates in response to the removal of aluminum or copper pan 46.

Detection signal Si of high level is applied to the base of transistor 168 through AND ate 222 and OR ate 224, so that transistor 168 discharges the charge potential of capacitor 166. Pulsating voltage Ve becomes immediately zero. Here, it is assumed that the charge operation starts at time t0. When time t1 has passed, pulsating voltage Ve exceeds reference voltage Vf1 (Ve>Vf1). Thus, voltage comparator 174 outputs signal Sb of low level. Signal Sb of low level deactivates transistor 218 in frequency state detecting circuit 206. Reference voltage Vi of voltage divider 214 rises to its prescribed higher voltage ViH, as shown in the drawing, from its prescribed middle voltage ViM (ViH>VhN−L>ViM), where VhN−L represents the value of control signal Vh output from F/V converter 208 at a non-load state of the apparatus.

Since, movable contact 44a of switch 44 is connected to first fixed contact 44b in this state, as described above, signal Se of high level is output from terminal 0 of switch control circuit 70. Signal Se of high level is applied to AND gate 222 together with detection signal Si of high level output from frequency state detecting circuit 206. Thus, the AND logic signal of high level is applied to transistor 168 through OR ate 224. Transistor 168 is again activated, so that the potential of pulsating voltage Ve is immediately discharged.

The above operation is repeated until pan 46 is loaded on the top plate of the apparatus. FIG. 7 shows the first cycle of the operations.

At time t0, output Sb from voltage comparator 174 changes to high level. Output Sb of high Level is applied to reset terminal R of switch control circuit 70. Thus, switch control circuit 70 controls switch 44, so that movable contact 44a is connected to first fixed contact 44b. As a result, the apparatus is set to the operation state for for aluminum or copper pan 46.

Before time t2, output Sc of voltage comparator 176 is high level. Output Sc of high level is applied to transistors 182 and 188 of voltage lowering circuits 180 and 186. Thus, reference voltages Vb and Vd are held to their initial values VbM and VdM, which are lower than their normal values VbH and VdH (VbM<VbH, VdM<VdH).

If pan 46 is loaded on the top plate of the apparatus during time t0 to time t3 in the repetition of the above operations, impedance state detecting circuit 66 operates to detect the load state of pan 46. That is, reference voltage Vb is lowered to its initial value VbM during time t0 to time t2. Thus, output voltage Vc of differential amplifier 154 is lowered. Output voltage Vc of low level is applied to voltage control circuit 28 for voltage controllable rectifier 22. As a result, voltage Ei of the DC power source obtained by rectifier 22 is lowered. Under the state that voltage Ei of low value is supplied t0 frequency inverter 30, reference voltage Vd of initial value VdM and output voltage Vc of low level are compared by voltage comparator 80 in impedance state detecting circuit 66.

If output voltage Vc of differential amplifier 158 is lower than reference voltage Vd of initial value VdM, impedance state detecting circuit 66 outputs signal Sg of low level. Signal Sg of low level is applied to switch control circuit 70, so that switch 44 is controlled to connect movable contact 44a to first fixed contact 44b. As a result, pan 46 loaded on the apparatus is judged to be a pan made of aluminum or copper.

If output voltage Vc of differential amplifier 158 is higher than reference voltage Vd of initial value VdM, impedance state detecting circuit 66 outputs signal Sg of high level. Signal Sg of high Level is applied to switch control circuit 70, so that switch 44 is controlled to connect movable contact 44a to second fixed contact 44c. As a result pan 46 loaded on the apparatus is judged to be a pan made of iron or magnetic stainless steel.

When time t2 has passed, reference voltages Vb and Vd change to their normal values VbH and VdH. Therefore, output voltage Vc of differential amplifier 158 rises. Voltage Ei of the DC power source also rises in response to output voltage Vc of differential amplifier 158.

The apparatus then operates to heat pan 46. During the operation state, output voltage Vc of differential amplifier 158 is higher than reference voltage Vg of voltage divider 198. If signal Sd of low level is output from voltage comparator 178, first non-load state detecting circuit 194 outputs detection signal Sh of low level.

In second non-load state detecting circuit 210, voltage signal Vh applied from F/V converter 208 is higher than reference voltage Vi of voltage divider 214. This is because pan 46 is loaded on the apparatus. Therefore, second non-load state detecting circuit 210 outputs detection signal Si of low level, if voltage comparator 178 outputs signal Sd of low level at time t3. Thus, transistor 168 in initializing circuit 172 is held in the deactivated state, so that pulsating voltage Ve is maintained at a level sufficiently higher than reference voltage Vf3. As a result, pulsating voltage Ve stops the repetition of the operations during time t0 to time t3.

If pan 46 is unloaded from the apparatus at time t4, as shown in FIGS. 7(f) and 7(j), the operation during time t0' to t3', which corresponds to the operations during time t0 to time t3, is carried out.

Figure 8:
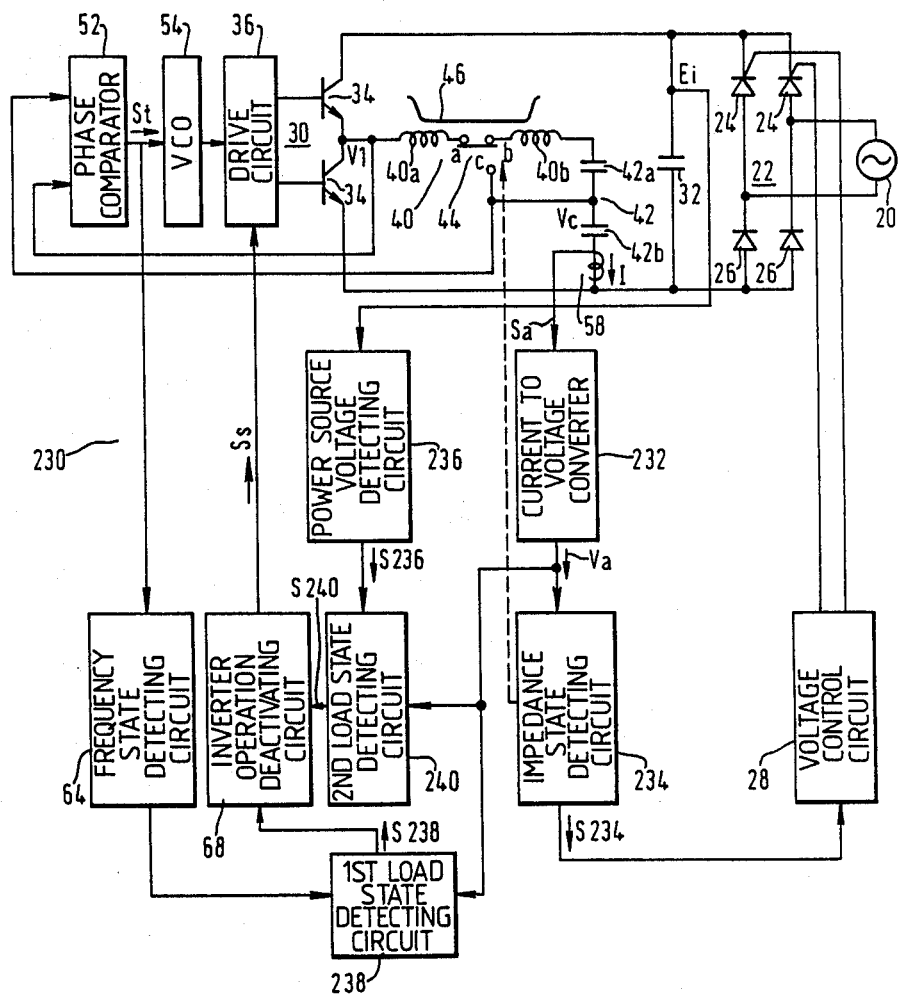
FIG. 8 is a block diagram showing a third embodiment of the induction heated cooking apparatus.
Figure 9:
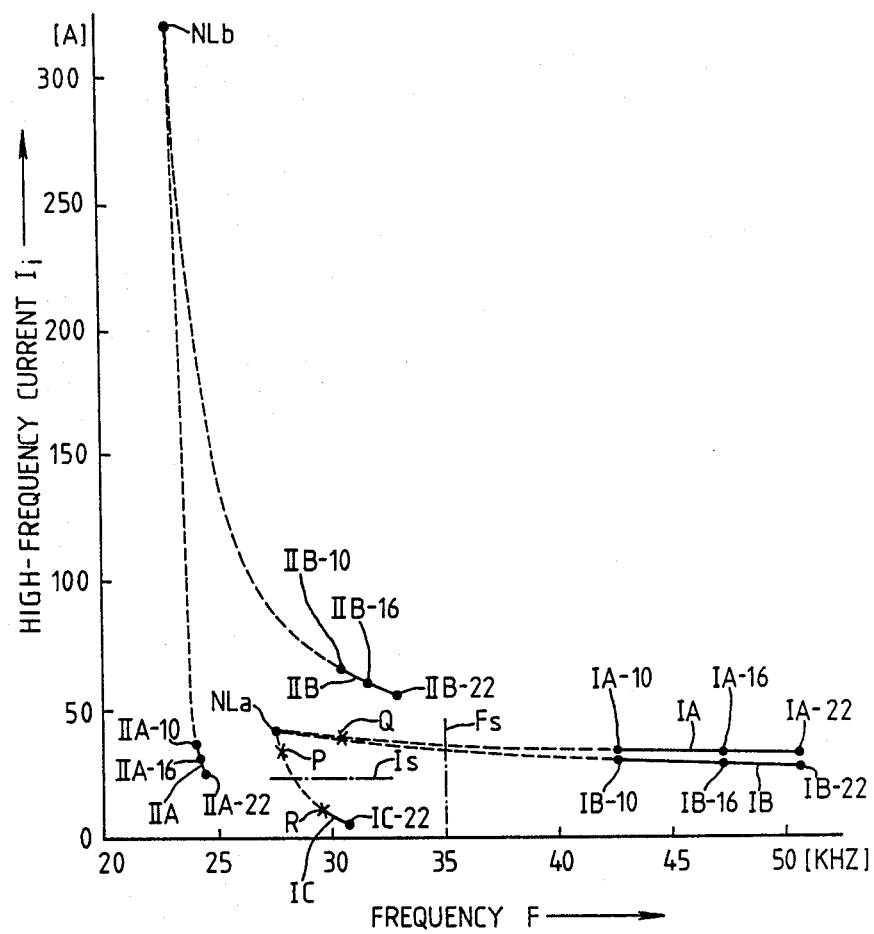
FIG. 9 is a graph showing frequency response characteristics for explanation of the embodiment of FIG. 8.
Figure 10:
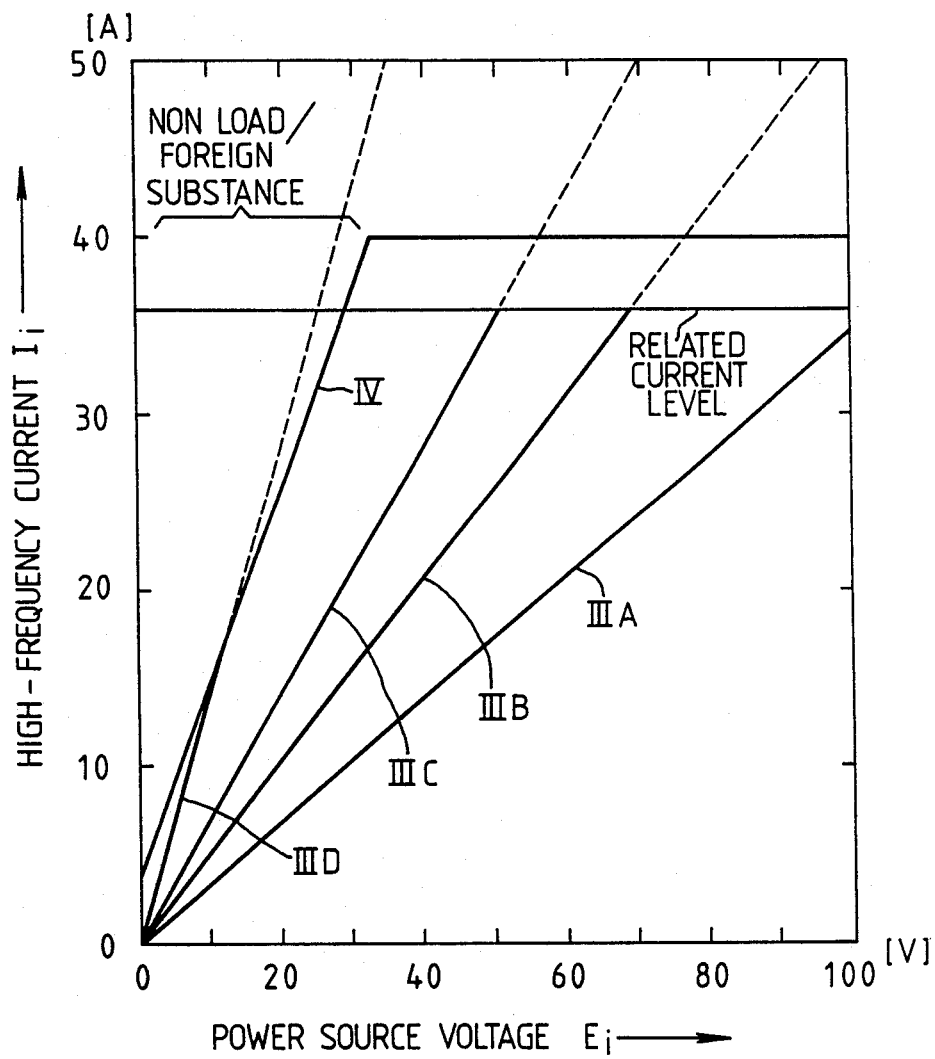
FIG. 10 is a graph showing current to voltage characteristics of the resonant circuit of the embodiment of FIG. 8 for materials of the cooking vessel.

Referring now to FIGS. 8 to 10, a third embodiment of the induction heated cooking apparatus according to the present invention will be described in detail. The inverter operation control circuit of the third embodiment of induction heated cooking apparatus is different from the aforementioned first embodiment of the induction heated cooking apparatus. Other portions are the same as those of the first embodiment. Therefore, only the different portions of the third embodiment of the induction heated cooking apparatus will be described. The same reference numerals as the first embodiment are used.

In FIG. 8, the induction heated cooking apparatus is provided with a current transformer 58 and an inverter operation control circuit 230. Current transformer 58 is provided for detecting the high-frequency current flowing through resonant circuit 38. Inverter operation control circuit 230 is provided with a current to voltage converter 232, an impedance state detecting circuit 234, voltage control circuit 28, a power source voltage detecting circuit 236, first and second load state detecting circuits 238 and 240, inverter operation deactivating circuit 68 and frequency state detecting circuit 64.

Current to voltage converter 232 is coupled to current transformer 58 for receiving an AC current Sa detected by current transformer 58 Current to voltage converter 232 converts the AC current signal Sa to a DC voltage signal Va. Voltage signal Va is therefore proportional to a high-frequency current Ii, which flows through resonant circuit 38. Voltage signal Va is supplied to impedance state detecting circuit 234. Impedance state detecting circuit 234 detects whether pan 46 is made of a low resistance material or a high resistance material. Impedance state detecting circuit 234 further outputs a control signal S234 of high level when voltage signal VaH, responding to a pan 46 made of high resistance material, is detected. Signal S234 is supplied to voltage control circuit 28.

Impedance state detecting circuit 234 controls switch 44 in accordance with a result of detection. When voltage signal VaL responding to a pan 46 made of low skin resistance material, such as iron or stainless steel, is detected, movable contact 44a is coupled to second fixed contact 44c. When voltage signal VaH responding to a pan 46 made of high skin resistance material, such as copper or aluminum, is detected, movable contact 44a is coupled to first fixed contact 44b. In the initial state of the apparatus, movable contact 44a is also coupled to first fixed contact 44b.

Frequency state detecting circuit 64 generates a control signal S64 in response to control signal Sf outputted from phase comparator 52. Thus, control signal S64 is proportional to resonant frequency F of resonant circuit 38. Control signal S64 is applied to first load state detecting circuit 238.

First load state detecting circuit 238 outputs a control signal S238 in response to control signal Va from current to voltage converter 232 and control signal S64 from frequency state detecting circuit 64. When control voltage Va is larger than a prescribed value and control signal S64 is smaller than a prescribed value corresponding to a prescribed frequency, e.g. 35 KHz, first load state detecting circuit 238 supplies inverter operation deactivating circuit 68 with control signal S238 of high level. Thus, inverter operation deactivating circuit 68 controls frequency inverter 30 to be deactivated in response to signal S238 of high level.

Power source voltage detecting circuit 236 detects the power source voltage Ei supplied from rectifier 22 to frequency inverter 30. A detection signal S236 detected by power source voltage detecting circuit 236 is applied to second load state detecting circuit 240.

Second load state detecting circuit 240 detects an excessive current state in response to signals S236 and Va outputted from voltage detecting circuit 236 and current t0 voltage converter 282, respectively. A detection signal S240 detected by second load state detecting circuit 240 is applied to inverter operation deactivating circuit 68. Thus, inverter operation deactivating circuit 68 controls frequency inverter 30 to be deactivated in response t0 signal S240 of high level.

Referring now to FIGS. 9 and 10, the operation of the third embodiment of the induction heated cooking apparatus will be described in detail below.

FIG. 9 shows the results of frequency response characteristics measured with many variety of objects, which are subjected to heat by the third embodiment of the induction heated cooking apparatus. In FIG. 9, Graphs IA, IB and IC correspond to frequency response characteristics of copper, aluminum and iron, when resonant circuit 38 is set for the load state of low resistance metal pan 46. In the load state, movable contact 44a of switch 44 is connected to first fixed contact 44b. Therefore, the total number of turns N of induction heating coil block 40 is sixty-five (N=65). Graphs IIA and IIB correspond to frequency response characteristics of iron and stainless steel, when resonant circuit 8 is set for the load state of high resistance metal pan 46. In the load state, movable contact 44a of switch 44 is connected to second fixed contact 44c. Therefore, the total number of turns N of induction heating coil block 40 is fifteen (N=65).

Three points on each Graph, e.g., A-10, A-16 and IA-22 show the characteristics of pans 46 with different diameters, i.e., 10 inches, 16 inches and 22 inches, respectively. Further, three points P, Q and R show the characteristics of foreign substances, i.e., relatively small number, e.g., one or two pieces of iron or stainless steel spoons, a relatively large number, e.g., four or five pieces of iron or stainless steel spoons and some number of copper or aluminum spoons, respectively, when they are erroneously placed on the apparatus instead of pan 46. The leftmost ends NLa and NLb of the two groups of the Graphs correspond to the characteristics of non-load conditions which occur in the load conditions of low and high resistance metal pans, respectively.

When a heating operation is commanded, the apparatus has been set initially to a prescribed state and maintained in the prescribed state for a prescribed period. Power source voltage Ei supplied from rectifier 22 is set to a prescribed low value for the prescribed INITIAL period. Frequency inverter 30 and resonant circuit 38 also are set for an operation suitable to the low resistance metal pan, e.g., copper or aluminum pan. Thus, movable contact 44a of switch 44 is connected to first fixed contact 44b.

(1) Heating operation for a load condition of low resistance metal pan, such as copper or aluminum:

Following controls are carried out during the prescribed initial period. In this case, high-frequency current Ii is larger than a prescribed value Is. This is because input impedance Z of resonant circuit 38 is low due to the load condition of low resistance metal pans, e.g., copper or aluminum pan 46. As a result, resonant circuit 38 is maintained in the prescribed initial state. After the prescribed initial period, power source voltage Ei supplied from rectifier 22 is raised to a prescribed high value for a normal heating operation. Then, the induction heating for the copper or aluminum pan is carried out.

(2) Heating operation for a non-load condition or a load condition f foreign substances like small number of iron or stainless steel spoons or some number of copper or aluminum spoons:

Following controls are carried out during the prescribed initial period. In this case, high-frequency current Ii is larger than the prescribed value Is. This is also because input impedance Z of resonant circuit 38 is low due to the non-load condition and the load condition of such foreign substances. As a result, resonant circuit 38 is maintained in the state &he same as the prescribed initial state.

However, resonant frequency F of resonant circuit 38 is lower than a prescribed frequency, e.g., 35 KHz, as shown by points NLa, P and R. Frequency state detecting circuit 64 outputs signal S64 of high level in response to such a low resonant frequency state. Signal S64 of high level is applied to first load state detecting circuit 238 so that signal S238 of high level is applied from first load state detecting circuit 238 to inverter operation deactivating circuit 68. Inverter operation deactivating circuit 68 thus deactivates the Operation of frequency inverter 30. As a result, the apparatus is prevented from the heating operation for the non-load condition or the load condition of foreign substances like one or two pieces of iron spoons or a couple of copper or aluminum spoons.

(3) Heating operation for a load condition of foreign substances like four or five pieces of iron spoons or a load condition of high resistance metal pan, such as iron or stainless steel pan:

Following controls are carried out during the prescribed initial period. In this case, high-frequency current Ii is smaller than the prescribed value Is, as shown by Graph C and point Q. This is because input impedance Z of resonant circuit 38 is high due to the load condition of high resistance metal pan, i.e., copper or aluminum pan 46. Thus, current to voltage converter 232 outputs signal Va of low level. Signal Va of low level is applied to impedance state detecting circuit 234. Impedance state detecting circuit 234 controls switch 44 in response to signal Va of low level so that movable contact 44a is connected to second fixed contact 44c. Therefore, resonant frequency F of resonant circuit 38 is defined by first coil 40a and second resonant capacitor 42b. As a result, resonant circuit 38 is set to the heating operation condition suitable for the high resistance metal pan, such as iron or stainless steel pan 46.

FIG. 10 shows the relation between high-frequency current Ii and power source voltage Ei for the load conditions of such foreign substances and the load conditions of the high resistance metal pan, such as iron or stainless steel pan 46. In FIG. 10, Graphs IIIA, IIIB, IIIC and IIID show the cases of iron pan, earthen pot for use of induction heating, stainless steel pan, and foreign substances like four or five pieces of iron spoons, respectively It is obvious that in the case of such foreign substances, high-frequency current Ii increases sharply as power source voltage Ei increases. Therefore, in second load state detecting circuit 240, a Graph is set as the threshold of high-frequency current Ii. The slope part of Graph IV has a sharp inclination than Graph C (corresponding to stainless steel pan). If high-frequency current Ii increases over the horizontal part of Graph IV, signal S240 of high level is outputted from second load state detecting circuit 240.

When signal S234 of high level, which represents the detection of high resistance materials, is outputted from impedance state detecting circuit 234. Signal S234 of high level is applied to voltage control circuit 28. Voltage control circuit 28 controls thyristors 24 in rectifier 22 so that a relatively low level, e.g., about 20V of power source voltage Ei is obtained.

Such a low level, e.g., about 20V, of power source voltage Ei is supplied to power source voltage detecting circuit 236 as well as frequency inverter 30. Thus, second load state detecting circuit 240 receives signal S236 corresponding to power source voltage Ei of about 20 V from power source voltage detecting circuit 236. Second load state detecting circuit 240 reads threshold value Is of high-frequency current Ii from the horizontal portion of Graph IV, then compares signal S232 obtained by current to voltage converter 232 with threshold value Is. Signal S232 is proportional to high-frequency current Ii.

When four to five pieces of iron or stainless steel spoons are placed on the top plate of the apparatus, high-frequency current Ii increases over threshold value Is. Second load state detecting circuit 240 outputs signal S240 of high level in response to the excessive current flow condition. Signal S240 of high level is applied to inverter operation deactivating circuit 68. Thereby inverter operation deactivating circuit 68 deactivates the opera ion of frequency inverter 30.

When iron or stainless steel pan 46 is placed on the top plate of the apparatus, high-frequency current Ii does not exceed threshold value Is. Therefore, power source voltage Ei, i.e., the input voltage to frequency inverter 30 is controlled by voltage control circuit 28 so that power source voltage Ei increases to a sufficient level but well below than threshold level Is. As a result, the ordinary heating operation is carried out.

The following effects are provided by the above structure of the third embodiment. The apparatus is initially set to the heating operation state suitable for low resistance metal vessel, such as copper or aluminum pan. During the prescribed initial period, the control operation for the apparatus is carried out in response to the load condition, as described above. When high-frequency current Ii flowing through resonant circuit 38 is higher than prescribed threshold vale Is, or resonant frequency F of resonant circuit 38 is lower than the prescribed frequency, operation control circuit 230 deactivates frequency inverter 30. Therefore, load conditions of low resistance metal pan and foreign substances placed erroneously on the apparatus can be detected. Besides, it is not necessary to change the number of turns of induction heating coil block 30 or the capacitance of resonant capacitor block 42. Switch 44 is left unchanged so that switching noises do not occur in the heating operation for the case. Further the service life of switch 44 can be elongated.

In the load conditions of high resistance metal pans, signal S240 of high level is outputted from second load state detecting circuit 240, when high-frequency current Ii of resonant circuit 38 exceeds the prescribed threshold value Is. Therefore, a relatively large amount of foreign substances, e.g., four or five pieces of iron spoons placed erroneously on the apparatus can be accurately detected, so that the operation of frequency inverter 30 can be deactivated.

In the above embodiment, the threshold value Is of second load state detecting circuit 240 is set as illustrated by Graph but it may be suitably changed as required resulting in acquiring the same function and effect.

The present invention is not restricted to the above description and the attached drawings. For example, the frequency inverter may be used in various forms. Micro computer may be employed to effect the controls, sa described above. Gate array IC (Integrated Circuit) or the like may be used to provide the controls. Thus, various modification and changes are possible without departing from the spirit or scope of this invention.

What is claimed is:

1. An induction heating cooking apparatus for heating a removable cooling vessel comprising a material selected from a group consisting of materials having a high resistance and materials having a low resistance, said apparatus comprising:

power source means for supplying power;
induction heating means responsive to the power source means for inducing an eddy current in the cooking vessel, said induction means including means for generating a high frequency current for inducing a magnetic field and induction coil means for inducing the eddy current responsive to the magnetic field;
impedance state detection means for detecting the high frequency current;

frequency state detection means for detecting the frequency of the high frequency current; and a control means for, in response to said impedance state detection means and said frequency state detection means, generating a first control signal to control said power source means and second and third control signals to control said induction heating means.

2. The apparatus of claim 1 wherein the control means includes switch means responsive to said second and third control signals for varying the frequency of the high frequency current.

3. The apparatus of claim 2 wherein the induction coil means includes a plurality of turns, the number of turns being variable between a high frequency resonant state and a low frequency resonant state in response to the switch means.

4. The apparatus of claim 3 further including deactivating means responsive to said first control signal for deactivating the apparatus.

5. The apparatus of claim 4 wherein the control means includes a first load state detecting means for detecting whether the high frequency current is larger than a prescribed current value and for detecting whether the frequency of the high frequency current is lower than a prescribed frequency value and a second load state detecting means responsive to the high frequency current and the power source voltage for detecting whether the high frequency current is higher than a predetermined current level.

6. The apparatus of claim 5 wherein the control means includes initializing means for setting the induction heating means in the high frequency resonant state for a prescribed initial period.

7. The apparatus of claim 6 wherein the second load state detecting means includes means for detecting a load state of the apparatus in response to the high frequency resonant state of the induction heating means.

* * * * *

UNITED STATES PATENT AND TRADEMARK OFFICE
CERTIFICATE OF CORRECTION

PATENT NO. : 4,820,891

DATED : April 11, 1989

INVENTOR(S) : Teruya Tanaka

It is certified that error appears in the above-identified patent and that said Letters Patent is hereby corrected as shown below:

ON THE FIRST INFORMATION PAGE:

Please Change

"(21) Appl. No.: 127,927"

to ---(21) Appl. No.: 127,027---.

Signed and Sealed this

Second Day of January, 1990

*Attest:*

JEFFREY M. SAMUELS

*Attesting Officer*     *Acting Commissioner of Patents and Trademarks*